United States Patent [19]

Carnall, Jr. et al.

[11] Patent Number: 5,043,139
[45] Date of Patent: Aug. 27, 1991

[54] AMALGAM PREFORM, METHOD OF FORMING THE PREFORM AND METHOD OF BONDING THEREWITH

[75] Inventors: Edward Carnall, Jr., Rochester; Edward J. Ozimek, Penfield, both of N.Y.

[73] Assignee: Eastman Kodak Company, Rochester, N.Y.

[21] Appl. No.: 594,793

[22] Filed: Oct. 9, 1990

[51] Int. Cl.$^5$ ................................................ C22C 7/00
[52] U.S. Cl. ..................................... 420/526; 420/527
[58] Field of Search ................... 420/526, 527; 148/24

[56] References Cited

U.S. PATENT DOCUMENTS 4,664,629  5/1987  Chodkowski ....................... 420/527

Primary Examiner—Peter D. Rosenberg

[57] ABSTRACT

The present invention relates to a preform of a solid body of an amalgam. The amalgam is a mixture of a metal which is liquid at room temperature and at least one powdered metal. The preform is formed by mixing together the ingredients of the amalgam and pouring the amalgam into a caity in a mold. The mold and amalgam is then cooled to a temperature below the melting temperature of the liquid metal in the amalgam. The preform is then removed from the mold. The preform can be stored at the low temperature until it is desired to use it to bond two bodies together. The preform can be used to bond two bodies together, such as the cover plate and housing of a microelectronic device package, by placing the preform between the two bodies. The bodies are mechanically scrubbed and clamped together with the preform therebetween and heated to a temperature at which the preform melts and the amalgam reacts to bond to the two bodies. Since the liquid metal in the amalgam has a melting temperature slightly above normal room temperature, the bonding can be achieved at relatively low temperatures.

14 Claims, 2 Drawing Sheets

AMALGAM PREFORM, METHOD OF FORMING THE PREFORM AND METHOD OF BONDING THEREWITH

FIELD OF THE INVENTION

The present invention relates to a preform of an amalgam, a method of forming the preform and a method of bonding therewith. More particularly, the present invention relates to a method of forming an amalgam preform and a method of forming a hermetically sealed microelectronic package using the preform.

BACKGROUND OF THE INVENTION

Microelectronic devices, such as various types of integrated circuits, are generally hermetically sealed in a package to protect the microelectronic device from being damaged and from the ambient. One type of package used comprises a ceramic housing which has a recess in a surface thereof in which the microelectronic device is mounted, and a cover plate extending over the recess and hermetically sealed to the housing. The cover plate may be a metal plate or a plate of an insulating material, such as glass or ceramic. The cover plate is generally sealed to the housing by a solder which adheres to the material of both the housing and the cover plate and which will withstand the operating temperature of the microelectronic device. Often, the housing and/or cover plate is provided with an adherent metal layer to which the solder will bond so as to provide the desired hermetic and mechanical bond between the housing and cover plate.

A problem with using solder for sealing the cover plate to the housing arises from the high temperature required to melt the solder when bonding the cover plate to the housing. There are some microelectronic devices that cannot stand such high temperature and which can be damaged during the bonding of the cover plate to the housing. For example, certain types of solid state image sensors include an optical filter layer or lenslets of a resin which will melt or degrade at the high temperatures required for melting solders. Therefore, it is desirable to have a sealing means for bonding a cover plate to a housing of a microelectronic package which can achieve the bond at a low temperature which does not adversely affect the microelectronic device in the package. One such sealing means is described in U.S. Pat. No. 4,895,291 to E. J. Ozimek et al, issued Jan. 23, 1990 and entitled "Method of Making a Hermetic Seal in a Solid-State Device". However, a problem with the sealing means described in this patent is that it melts at the same low temperature at which it is formed. Thus, if the microelectronic device is subjected to that low temperature the bond is destroyed. Therefore, the sealing means not only must be capable of being formed at relatively low temperatures and provide both a good mechanical and hermetic seal between the cover plate and housing, but also must be capable of withstanding the operating temperature of the microelectronic device which can be higher than the temperature at which the bond is initially formed.

In our copending U.S. patent application Ser. No. 594,789), which is being filed concurrently with the present application and which is entitled "Hermetically Sealed Microelectronic Package and Method of Making the Same", there is described a seal for a microelectronic package which can be formed at relative low temperatures, but which withstands much higher temperatures. The seal of this copending patent application comprises the use of an amalgam to bond the cover plate to the housing of the package and form a hermetic seal therebetween. The amalgam comprises a mixture of a liquid metal, such as mercury or gallium, and a powdered metal or combination of powdered metals, such as powders of copper, nickel, cobalt, gold, silver, tin, magnesium, antimony, manganese, chromium, titanium, molybdenum, aluminum, iron and combinations of these metals. A problem with the use of an amalgam is that the consistency of the amalgam makes it diffcult to apply it to the parts to be bonded together and particularly to apply an uniform amount of the amalgam to the parts. Therefore, it is desirable to have an amalgam in a form which can be easily applied to the parts to be bonded together, such as the cover plate or housing of a microelectronic package, in a layer of uniform thickness to achieve a good bond between the parts.

As shown in U.S. Pat. No. 4,328,921 (S.C. Liang, issued May 11, 1982), entitled "Attachment of Solder Preform to a Cover For a Sealed Container", solders have been formed into preforms of the desired shape and thickness to be used in the bonding of two parts together. However, an amalgam is in a liquid state near room temperature so that it cannot be formed into a preform in the same manner as a solder. Therefore, it would be desirable to have a method of forming an amalgam into a preform to allow it to be used more easily to bond two parts together.

SUMMARY OF THE INVENTION

The present invention relates to a preform of an amalgam to be used in bonding two parts together and a method of forming the preform. The preform is a hard body of an amalgam which comprises a mixture of a metal which is liquid at room temperature and a powdered metal. The method comprises mixing together a liquid metal and a powdered metal to form the amalgam. The amalgam is then poured into a mold of the desired shape and size. The amalgam in the mold is then cooled to a temperature at which the amalgam hardens to form the preform.

A microelectronic device package having a housing containing a microelectronic device in a cavity therein and a cover plate extending over the cavity and bonded to the housing is formed by forming the preform of the amalgam as stated above. The hardened preform is removed from the mold and placed between the cover plate and the housing. The preform is then bonded to the cover plate and housing to secure the cover plate to the housing.

The invention will be better understood from the following more detailed description taken with the accompanying drawings and claims.

It should be understood that the drawings are not necessarily all to scale.

DETAILED DESCRIPTION

In accordance with the present invention, a preform of an amalgam is made by first mixing together the ingredients of the amalgam. An amalgam is a mixture of a metal which is liquid at room temperature, such as mercury or gallium, and a metal powder or mixture of metal powders. The metal powder can be selected from a large number of metals well known for use in amalgams, such as copper, nickel cobalt, gold, silver, tin, magnesium, antimony, manganese, chromium, titanium, molybdenum, aluminum, iron and combinations of these metals. In general, the liquid metal is present in the amalgam in the amount of 55% to 95% by weight. For use in sealing microelectronic packages, gallium is preferred as the liquid metal because mercury is toxic and can adversely affect the electrical characteristics of certain types of microelectronic devices. Copper and nickel are preferred as the powdered metal because they form amalgam having desirable properties, are relatively inexpensive and are readily available. In an amalgam comprising liquid gallium and powdered copper and/or nickel, the gallium is present in the amount of 65% to 70% by weight. The amalgam can be formed by placing the ingredients in a container and mixing them together, preferably by a hammering process with a stainless steel pestle. However, for large scale operations there are machines available which will automatically mix the ingredients of the amalgam.

After the ingredients of the amalgam are mixed together, the amalgam is poured into a mold having a mold cavity of the desired shape and size.

Figure 1:
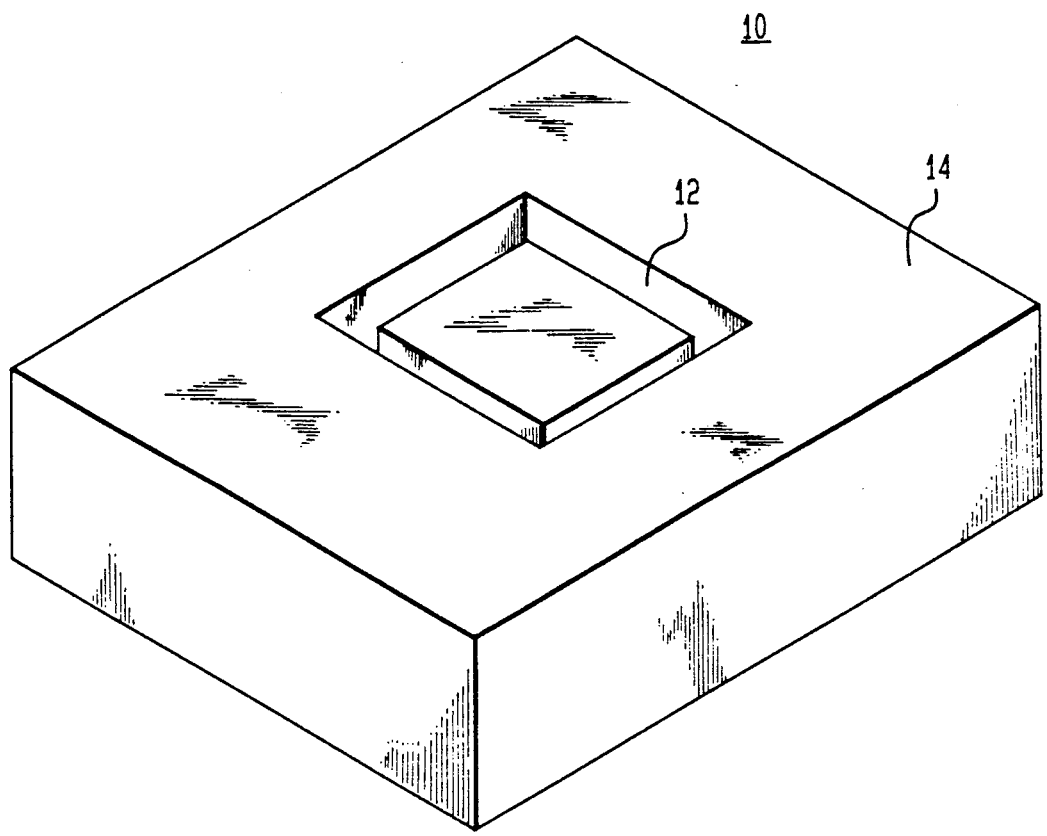
FIG. 1 is a perspective view of a mold for forming the amalgam preform of the present invention.
Figure 2:
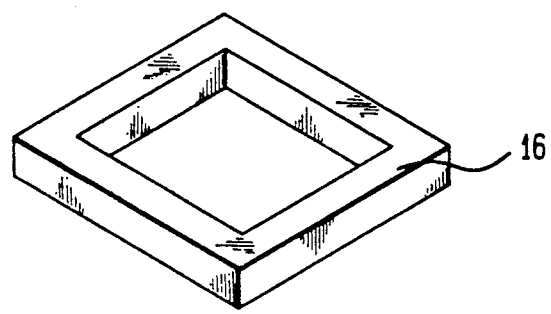
FIG. 2 is a perspective view of an amalgam preform.

Referring now to FIG. 1, there is shown a mold 10 which defines a mold cavity 12 in a portion of a surface 14 thereof. Cavity 12 is in the form of a narrow rectangular ring which is useful to form a preform for bonding a cover plate (see for example cover plate 32 of FIG. 3) to a housing (see housing 24 of FIG. 3) of a microelectronic package (see package 18 of FIG. 3). The mold 10 can be of any material which will not react with the material of the amalgam and which will allow easy removal of the preform. Plastics are suitable for the mold 10 and particularly polytetrafluoroethyelene. After the liquid amalgam is poured into the mold cavity 12, the mold 10 and its contents are cooled to a temperature below the melting point of the liquid metal in the amalgam. For gallium, this is below 29.78° C. This cooling may be achieved by placing the mold 10 in a cooling chamber or a cryogenic fluid. After the amalgam has hardened, it can be removed from the mold 10 to provide a preform 16, as shown in FIG. 2. Although the preform 16 remains hard if kept just below the melting temperature of the liquid metal, it is preferred to cool the preform at and maintain it at a much lower temperature, between 5° C. and 10° C. The lower temperature is preferred since it seems to maintain the amalgam more stable at the lower temperature. When the preform 16 is to be used to bond two parts together, it can be removed from the cold ambient and placed between the parts to be bonded together.

Figure 3:
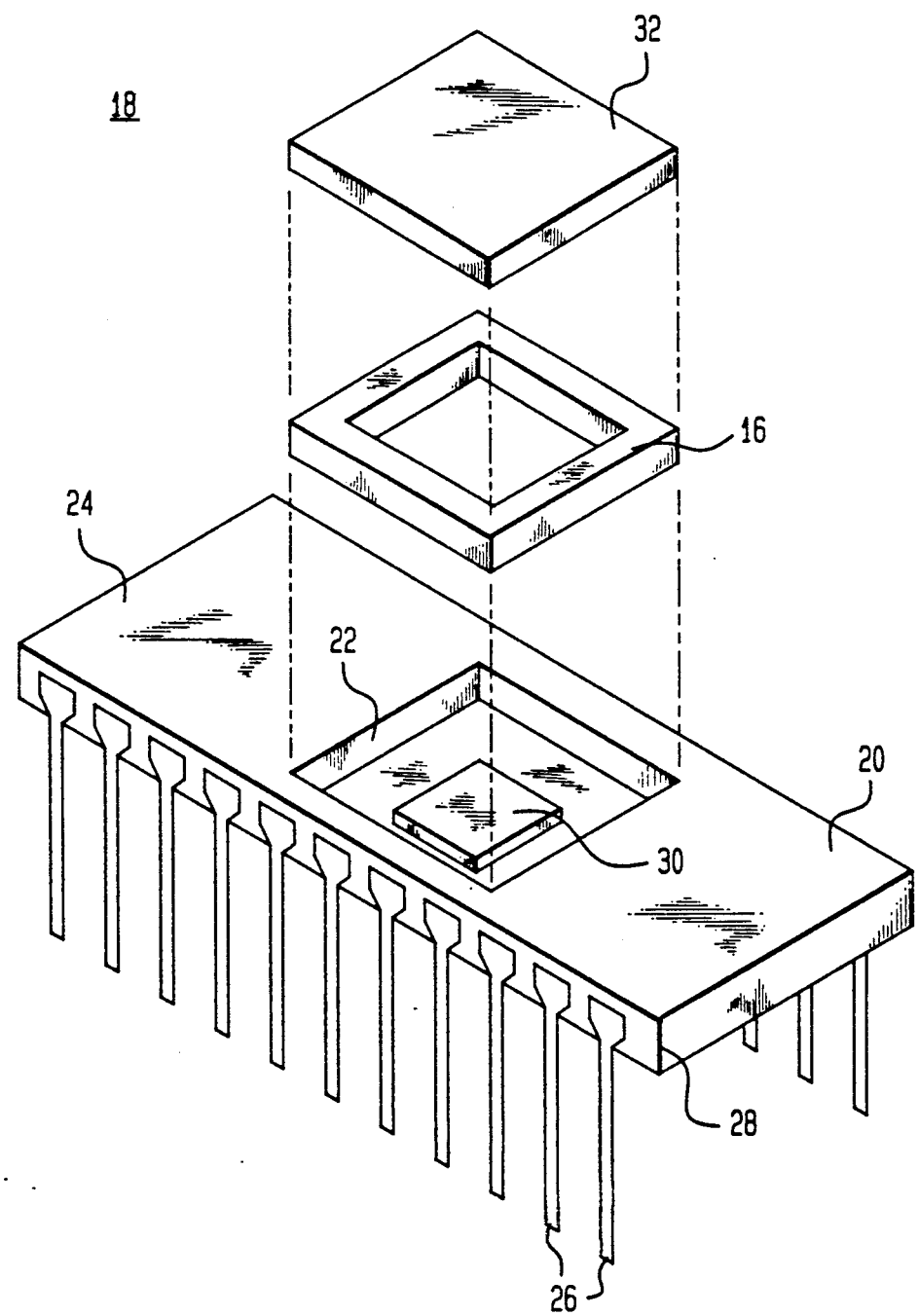
FIG. 3 is an exploded perspective view of a microelectronic device package formed with the amalgam preform.

Referring now to FIG. 3, there is shown an exploded perspective view of a microelectronic device package 18 which can be hermetically sealed using the amalgam preform 16 (also shown in FIG. 2) in accordance with the present invention. The package 18 comprises a rectangular housing 20, preferably of a ceramic material, such as alumina, which defines a cavity 22 in a surface 24 thereof. Terminals (electrical pins) 26 extend through sides 28 of the housing 20 to the cavity 22. A microelectronic device 30 is mounted in the cavity 22 and is electrically connected to the terminals 26 in the cavity 22. Although the microelectronic device 30 can be of any type, such as an integrated circuit, it is preferable to be of the type which has features which cannot withstand high temperatures. For example, the microelectronic device 30 can be a solid-state image sensor having a filter layer or lenslets of a resin material which cannot withstand high temperatures. A cover plate 32 is provided over the cavity 22 and microelectronic device 30 and extends over a portion of the housing surface 24 around the cavity 22. The cover plate 32 can be of a metal or a ceramic. For a package 18 containing a solid-state image sensor, it is preferable that the cover plate 32 be of a transparent glass, such as a borosilicate glass. The amalgam preform 16 is positioned between the cover plate 32 and the housing surface 24 and is bonded thereto to form a hermetic seal between the cover plate 32 and housing 20. The cover plate 32 and housing 20 may have an adhesion layer, not shown, thereon which is preferably of the same metal as one of the powdered metals in the amalgam.

To assemble the package 18, the housing 20 and cover plate 32 are first cleaned prior to mounting the microelectronic device 30 in the cavity 22. A housing 20 of a ceramic may be cleaned by subjecting it to ultraviolet radiation in ozone to remove any organic matter on the housing. A glass cover plate 32 may be cleaned by immersing it in a chromerge solution and then rinsing it with deionized water. A chromerge solution is a concentrated sulfuric acid solution of potassium dichromate. Preferably, the glass cover plate 32 is immersed several separate times in the chromerge solution for a short period of time, 5 to 10 minutes, with each immersion being followed by a rinsing with deionized water. After the housing 20 and cover plate 32 is cleaned, the microelectronic device 30 is mounted in the housing 20. The housing 20 and cover plate 32 are then heated at a relatively low temperature (e.g., about 80° C.) in air, an inert gas or in a vacuum for a relatively short period of time (e.g., about 2 to 3 minutes). The amalgam preform 16 is then placed on the heated housing surface 24 around the cavity 22, and the heated cover plate 32 is placed on the preform 16 and over the cavity 22. The cover plate 32 and the housing 20 are then mechanically scrubbed, clamped together and placed in an oven at a temperature above the melting temperature of the liquid metal. The assembly is maintained at that temperature until the ingredients of the amalgam react to form the amalgam and bond to the cover plate 32 and housing 20 to form a hermetic seal therebetween. It may be desirable to coat the opposed surfaces of the cover plate 32 and housing 20 with a sealing pad, not shown, of one of the powdered metals in the amalgam. Thus, the liquid metal in the amalgam of the preform 16 will react with the sealing pads to provide a strong bond therewith.

Thus there is provided by the present invention a preform of an amalgam which can be used to bond two parts together. The preform is formed by pouring the mixture of the amalgam into a mold of the desired shape and size of the preform and cooling the mold and amalgam to a temperature below the melting temperature of the liquid metal in the amalgam. The preform can then be removed from the mold for use in bonding two parts together. The preform does not have to be used immediately, but can be stored at the reduced temperature in air, an inert gas or a vacuum until it is required. It is preferred to store the preform in an inert gas or a vacuum to prevent powder oxidation. When used to bond two parts together, the preform is placed between the two parts which are clamped together. The assembly is then heated to melt the preform and cause the amalgam to react and bond to the two parts. The amalgam preform is particularly useful in bonding together the cover plate and housing of a microelectronic device package, and more particularly to such a package for a microelectronic device which has features that cannot withstand high temperatures, such as a solid-state image sensor.

It is to be appreciated and understood that the specific embodiments of the invention are merely illustrated of the general principles of the invention. Various modifications may be made consistent with the principles set forth. For example, although the preform is shown to be rectangular, it can be of any desired shape and size required for bonding the desired two parts together. Still further, although the preform has been described for use in bonding a microelectronic package containing a solid-state image sensor, the preform can be used to bond any two parts together. However, it is particularly useful in bonding two parts together where the parts or related features cannot withstand high temperatures since the amalgam preform allows the bond to be made at relatively low temperatures.

What is claimed is:

1. A preform comprising a solid unamalgamated body of an amalgam composition formed of a mixture of a metal which is liquid at room temperature and a powdered metal.

2. The preform of claim 1 wherein the body is at a temperature below the melting temperature of the liquid metal.

3. The preform of claim 2 in which the liquid metal is selected from the group consisting of mercury and gallium.

4. The preform of claim 3 in which the powdered metal is selected from the group consisting of copper, nickel, cobalt, silver, gold, magnesium, tin, antimony, manganese, chromium, titanium, molybdenum, aluminum, iron and combinations thereof.

5. The preform of claim 4 in which the liquid metal is present in the mixture in the amount of 55% to 95% by weight.

6. The preform of claim 2 in which the body is a temperature of between about 5° C. and 10° C.

7. A method of forming an unamalgamated amalgam preform comprising the steps of:
mixing together a liquid metal and at least one powdered metal to form an amalgam composition;
pouring the amalgam composition into a mold cavity of the size and shape of the desired preform; and then
cooling the amalgam composition in the mold to a temperature at which it hardens to form a solid unamalgamted preform.

8. The method of claim 7 in which the amalgam composition is cooled to a temperature below the melting temperature of the liquid metal.

9. The method of claim 8 in which after the amalgam composition hardens the preform is removed from the mold cavity.

10. The method of claim 9 in which the liquid metal, is selected from the group consisting of mercury and gallium.

11. The method of claim 10 in which the powdered metal is selected from the group consisting of copper, nickel, cobalt, gold, silver, magnesium, tin, antimony, manganese, chromium, titanium, molybdenum, aluminum, iron and combinations thereof.

12. The method of claim 11 in which the liquid metal is present in the mixture in the amount of 55% to 95% by weight.

13. The method of claim 8 in which the amalgam composition is cooled to a temperature of about 5° C. and 10° C.

14. The method of claim 13 in which after the amalgam composition is hardened, the preform is removed from the mold and maintained at the cooled temperature in air, an inert gas or a vacuum.

* * * * *